(12) United States Patent
Van Elmpt et al.

(10) Patent No.: US 10,299,441 B2
(45) Date of Patent: May 28, 2019

(54) HORTICULTURE LIGHTING DEVICE AND A METHOD TO STIMULATE PLANT GROWTH AND BIO-RHYTHM OF A PLANT

(71) Applicant: SIGNIFY HOLDING B.V., Eindhoven (NL)

(72) Inventors: Rob Franciscus Maria Van Elmpt, Eindhoven (NL); Henricus Marie Peeters, Eindhoven (NL); Rifat Ata Mustafa Hikmet, Eindhoven (NL); Martinus Petrus Joseph Peeters, Eindhoven (NL); Dirk Veldman, Eindhoven (NL); Paulus Albertus Van Hal, Eindhoven (NL); René Theodorus Wegh, Eindhoven (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 438 days.

(21) Appl. No.: 14/759,272

(22) PCT Filed: Jan. 7, 2014

(86) PCT No.: PCT/IB2014/058092
§ 371 (c)(1),
(2) Date: Jul. 6, 2015

(87) PCT Pub. No.: WO2014/108825
PCT Pub. Date: Jul. 17, 2014

(65) Prior Publication Data
US 2016/0000018 A1 Jan. 7, 2016

Related U.S. Application Data
(60) Provisional application No. 61/751,285, filed on Jan. 11, 2013.

(51) Int. Cl.
*A01G 7/04* (2006.01)
*F21V 9/30* (2018.01)
*F21K 9/64* (2016.01)
*H01L 33/50* (2010.01)
(Continued)

(52) U.S. Cl.
CPC ............... *A01G 7/045* (2013.01); *F21K 9/64* (2016.08); *F21V 9/30* (2018.02); *H01L 33/502* (2013.01);
(Continued)

(58) Field of Classification Search
CPC .......... A01G 7/045; F21K 9/00; Y02P 60/149
(Continued)

(56) References Cited

U.S. PATENT DOCUMENTS 5,512,210 A 4/1996 Sluzky
2009/0128028 A1* 5/2009 Hildenbrand ........... H01L 33/44
313/507

(Continued)

FOREIGN PATENT DOCUMENTS

CN 1072945 A 6/1993
CN 1934214 A 3/2007
(Continued)

*Primary Examiner* — William J Carter

(57) ABSTRACT

The present invention relates to a lighting device (100) to stimulate plant growth and bio-rhythm of a plant. The lighting device (100) comprising a solid state light source (102) arranged to emit direct red light having a wavelength of 600 to 680 nm, preferably 640 to 680 nm, and a wavelength converting member (106) arranged to receive at least part of said direct red light emitted from said solid state light source (102) and to convert said received direct red light to far-red light having a maximum emission wavelength of 700 to 760 nm, preferably 720 to 760 nm.

13 Claims, 5 Drawing Sheets

(51) Int. Cl.
*H05B 33/14* (2006.01)
*H01L 25/075* (2006.01)
*H01L 33/54* (2010.01)

(52) U.S. Cl.
CPC .......... *H05B 33/14* (2013.01); *H01L 25/0753* (2013.01); *H01L 33/507* (2013.01); *H01L 33/54* (2013.01); *H01L 2924/0002* (2013.01); *Y02P 60/149* (2015.11)

(58) Field of Classification Search
USPC .................................................... 362/2, 805
See application file for complete search history.

(56) References Cited

U.S. PATENT DOCUMENTS

| | | | | |
|---|---|---|---|---|
| 2010/0254115 | A1* | 10/2010 | Wegh | F21S 10/02 362/84 |
| 2010/0264429 | A1* | 10/2010 | Liu | C09K 11/584 257/88 |
| 2010/0320480 | A1 | 12/2010 | Rapoport | |
| 2011/0068697 | A1* | 3/2011 | Hum | H01L 25/0753 315/152 |
| 2011/0176289 | A1* | 7/2011 | Ramer | F21K 9/23 362/84 |
| 2012/0007131 | A1 | 1/2012 | Ueno et al. | |
| 2012/0075848 | A1* | 3/2012 | Yamada | A01G 7/045 362/231 |
| 2013/0127329 | A1* | 5/2013 | Komada | F21V 9/02 362/231 |

FOREIGN PATENT DOCUMENTS

| | | |
|---|---|---|
| CN | 101836160 A | 9/2010 |
| CN | 102257646 A | 11/2011 |
| EP | 2499900 A1 | 9/2012 |
| KR | 2000018096 A | 4/2000 |
| WO | 199950916 A1 | 10/1999 |
| WO | 2010053341 A1 | 5/2010 |

* cited by examiner

HORTICULTURE LIGHTING DEVICE AND A METHOD TO STIMULATE PLANT GROWTH AND BIO-RHYTHM OF A PLANT

CROSS-REFERENCE TO PRIOR APPLICATIONS

This application is the U.S. National Phase application under 35 U.S.C. § 371 of International Application No. PCT/IB2014/058092, filed on Jan. 7, 2014, which claims the benefit of U.S. Provisional Patent Application No. 61/751,285, filed on Jan. 11, 2013. These applications are hereby incorporated by reference herein.

FIELD OF THE INVENTION

The present invention relates to a horticulture lighting device, and a method to stimulate plant growth and bio-rhythm of a plant. The present invention further relates to a luminaire comprising said horticulture lighting device, and a horticulture application comprising said horticulture lighting device or said luminaire.

BACKGROUND OF THE INVENTION

It is known that photophysiological processes are crucial for plant growth and that these processes are controlled by photopigments, which exhibit strongly wavelength dependent absorption spectra. Chlorophylls, for example absorb light in the wavelength range of approximately 620 nm to 680 nm, whereas different forms of phytochrome, Phytochrome reduced (Pr) and Phytochrome far-red (Pfr), which regulate a range of molecular and physiological responses in plants, react to light within wavelength ranges centered in the red and far-red, respectively. The ratio, for example, between the absorption by Pr and Pfr controls physiological processes in plants like blossom induction, stem stretching, germination etc.

To improve the spectral profile of artificial illumination of plants, fluorescent lamps, which are commonly low-pressure mercury vapor discharge lamps with phosphor coating, can be used. These lamps, however, disclose a number of drawbacks such as limited efficiency, contain mercury which is a hazardous agent, have short lifetime, are fragile, require high voltage, and emit unwanted infrared light.

Alternatively, are today solid state light sources such as Light Emitting Diodes (LEDs) also used for plant illumination, since LEDs provide longer lifetime, higher photon flux efficacy, lower operating voltage, narrow-band light emission, and flexibility in terms of assembly compared to conventional light sources.

WO 2010/053341 discloses a phosphor converted LED for plant cultivation comprising a semiconductor chip, generating short-wavelength (blue or near-UV) light, and a wavelength converter containing at least one phosphor, converting the said short-wavelength light to longer-wavelength light due to photoluminescence. The longer-wavelength light contains a far-red spectral component peaking in the spectral range of about 700 nm to 760 nm, corresponding to the absorption spectrum of Pfr.

To this end, far-red light can also be achieved by using direct far-red LEDs, which are for instance based on AlGaAs or AlInGaP semiconductor materials.

There are, however, problems related to prior art; far-red light generating LEDs using phosphor conversion from blue light are, for instance, due to their inherent large Stokes shift, not efficient. The direct far-red LEDs are also relatively inefficient and furthermore not widely available.

There is, therefore, a need for abundant artificial light sources providing more efficient narrow wavelength band illumination during plant cultivation.

SUMMARY OF THE INVENTION

An object of the present invention is to solve or at least to reduce the problems discussed above.

In particular according to a first aspect of the invention, a horticulture lighting device is provided. The device comprises a solid state light source arranged to emit direct red light having a maximum emission wavelength of 600 to 680 nm, preferably 640 to 680 nm, and a wavelength converting member arranged to receive at least part of the direct red light emitted from the solid state light source and to convert the received direct red light to far-red light having a maximum emission wavelength of 700 to 760 nm, preferably 720 to 760 nm.

An advantage of this device is that it utilizes highly efficient direct red LEDs and the low Stokes loss associated with the conversion from red light to far-red light. Direct red LEDs, emitting light with a maximum emission wavelength of e.g. 660 nm, are readily available at very high efficiencies: Wall-Plug Efficiency (WPE) exceeding 50%. The Stokes loss for conversion from 660 nm to 740 nm is only about 10%. As a result the efficiency of the device is increased as compared with prior art devices. Additionally, only one type of wavelength converting member is needed in combination with the solid state light source to generate light emission in the red as well as far-red spectral ranges. The low number of components needed to achieve the desired light emission is advantageous in view of easy assembly, low consumption of material as well as to price when producing the lighting device according to the present invention. Accordingly, the provided horticulture lighting device is arranged, in an efficient way, to generate a combination of red and far red light. This is particularly useful for stimulating plant growth and/or bio-rhythm of the plant by mimicking the color change of daylight. Hence, e.g. both Phytochrome reduced (Pr) and Phytochrome far-red (Pfr) may be influenced in an efficient way using the provided lighting device.

In the context of the present invention the term red light should be understood as light having energies corresponding to a wavelength range of 600 to 680 nm. In a preferred embodiment of the present invention the wavelength range of the red light is narrower 640 to 680 nm to further optimize the efficiency of the lighting device.

Similarly, the term far-red light should be understood as light having energies corresponding to a wavelength range of 700 to 760 nm. In a preferred embodiment of the present invention the wavelength range of the far red light is narrower 720 to 760 nm to further optimize the efficiency of the lighting device.

The wordings direct red or direct far-red light should be construed as red light or far-red light generated directly by the solid state light source without any secondary optical processes outside the solid state light source.

By wavelength converting member is meant a phosphor material, capable of converting light of a first wavelength range into light of a second wavelength range, the second wavelength range being Stokes shifted in respect to the first wavelength range.

A phosphor material is, in context of the present invention, defined as a material or substance exhibiting light emission after excitation in luminescence, fluorescence or phosphorescence processes.

According to another embodiment of the present invention, a ratio of the direct red to the far-red light emitted from the horticulture lighting device is set by adjusting the fraction of the direct red light impinging on the wavelength converting member from the solid state light source. This provides simple means for adjusting the ratio of direct red to far-red light and hence influencing plant growth and development.

According to yet another embodiment of the present invention the solid state light source and the wavelength converting member is assembled to a single unit which simplifies assembly of light sources in arrays or other configurations providing efficient illumination of plants.

The single unit may further, according to another embodiment, comprise at least one additional solid state light source arranged to emit the direct red light. This may provide an additional freedom to tune a ratio of the direct red to the far-red light and improve the light intensity of the red and/or far-red spectral components, as desired for improved plant cultivation.

According to a second aspect of the present invention a method to stimulate plant growth and bio-rhythm of a plant is provided, where the method comprises the steps of generating direct red light having a maximum emission wavelength of 600 to 680 nm, preferably 640 to 680 nm, using a solid state light source, receiving at least part of the direct red light at a wavelength converting member, and converting the received direct red light to far-red light having a maximum emission wavelength of 700 to 760 nm, preferably 720 to 760 nm, using the wavelength converting member, thus allowing for influence the photomorphogenesis of plants.

According to a third aspect of the present invention a luminaire comprising at least one horticulture lighting device as described herein, is provided.

A horticulture lighting device is arranged to generate horticulture light. The term "horticulture light" may, by way of example, relate to light having a spectral distribution with a light intensity at a first wavelength selected from the range of 400-475 nm and at a second wavelength selected from the range of 600-800 nm. This does not imply that the light from the horticulture lighting device, when switched on, will always include intensity in both regions. The lighting device may provide light with intensity in only one of the spectral ranges, such as blue light or (far) red light, or in different spectral ranges. Further, due to the fact that the device may comprise a plurality of LEDs, it may well be that one or more LEDs mainly give blue light, while one or more other LEDs may mainly give (far) red light (see also below). The phrase "wavelength selected from the range" may also include the use of band emitters, even band emitters that also emit outside the range, though at least emitting at a wavelength in said range. This phrase may especially, but not exclusively, include emitters that have a dominant emission wavelength in this range.

The term "horticulture" relates to (intensive) plant cultivation for human use and is very diverse in its activities, incorporating plants for food (fruits, vegetables, mushrooms, culinary herbs) and non-food crops (flowers, trees and shrubs, turf-grass, hops, grapes, medicinal herbs). The term "crop" is used herein to indicate the horticulture plant that is grown or was grown. Plants of the same kind grown on a large scale for food, clothing, etc., may be called crops.

A crop is a non-animal species or variety that is grown to be harvested as e.g. food, livestock fodder, fuel, or for any other economic purpose. The term "crop" may also relate to a plurality of crops. Horticulture crops may especially refer to food crops (tomatoes, peppers, cucumbers and lettuce), as well as to plants (potentially) bearing such crops, such as a tomato plant, a pepper plant, a cucumber plant, etc. Horticulture may herein in general relate to e.g. crop and non-crop plants. Examples of crop plants are Rice, Wheat, Barley, Oats, Chickpea, Pea, Cowpea, Lentil, Green gram, Black gram, Soybean, Common bean, Moth bean, Linseed, Sesame, Khesari, Sunhemp, Chillies, Brinj al, Tomato, Cucumber, Okra, Peanut, Potato, Corn, Pearlmillet, Rye, Alfalfa, Radish, Cabbage, lettuce, pepper, Sunflower, Sugarbeet, Castor, Red clover, White clover, Safflower, Spinach, Onion, Garlic, Turnip, Squash, Muskmelon, Watermelon, Cucumber, Pumpkin, Kenaf, Oilpalm, Carrot, Coconut, Papaya, Sugarcane, Coffee, Cocoa, Tea, Apple, Pears, Peaches, Cherries, grapes, Almond, Strawberries, Pine apple, Banana, Cashew, Irish, Cassava, Taro, Rubber, Sorghum, Cotton, Triticale, Pigeonpea, and Tobacco. Especial of interest are tomato, cucumber, pepper, lettuce, water melon, papaya, apple, pear, peach, cherry, grape, and strawberry.

Horticulture crops may especially be grown in a greenhouse. Hence, the invention especially relates to the application of the device and/or the method in a greenhouse. The device may be arranged between plants, or between plants to be, which is referred to as "inter-lighting". Horticulture growth on wires, like tomato plants, may be a specific field of application for inter-lighting, which application may be addressed with the present device and method. The device may also be arranged on top of plants or plants to be. Especially when horticulture crops are grown in layers on top of each other, artificial lighting is necessary. Growing horticulture crops in layers is indicated as "multi-layer growth" and may take place in a plant factory. Also in multi-layer growth, the device and/or method may be applied.

Therefore, in a fourth aspect according to the present invention, a horticulture application is provided, especially selected from the group comprising a greenhouse and a plant factory, wherein the horticulture application further comprises the horticulture lighting device or the luminaire, such as described herein. In an embodiment, such horticulture application comprises a plurality of said luminaires, wherein said luminaires are optionally configured to illuminate crops sideways within said horticulture application. In another embodiment, the horticulture application comprises multiple layers for multi-layer crop growth, the horticulture application further comprising a plurality of said luminaires, configured for lighting the crops in said plurality of layers.

Especially in greenhouses wherein horticulture crops are grown in rows, sideways illumination of the crop may be applied. The phrase "sideways illumination of the crop" especially indicates a configuration of the lighting device such that during at least part of the growth process of the crop, the crop is illuminated from a side. This does not exclude (additional) top lighting, but at least the horticulture lighting device according to the invention is configured in such a way that the crop is lit from a side of the crop during at least part of the growth process of the crop. Assuming a growth of crops in rows, at least part of the horticulture lighting device, especially at least part of its light emitting surface, may be arranged in between the rows of crops. Hence, at least part of the horticulture lighting device according to the invention may have a horizontal propagation component and illuminate one or more crops. An advantage of side lighting is that the crops may be better (more integrally) illuminated, energy use is more efficient and thus total energy consumption may be reduced, and especially with the device of the invention, it may be possible to select a specific color to meet the demand of the crop in a specific stadium.

It is noted that the invention relates to all possible combinations of features recited in the claims.

BRIEF DESCRIPTION OF THE DRAWINGS

This and other aspects of the present invention will now be described in more detail, with reference to the appended drawings showing embodiments of the invention.

In FIGS. 2 and 3 the sizes of layers and regions are exaggerated for illustrative purposes and, thus, are provided to illustrate the general structure of an embodiment of the present invention.

DETAILED DESCRIPTION

The present invention will now be described more fully hereinafter with reference to the accompanying drawings, in which currently preferred embodiments of the invention are shown. This invention may, however, be embodied in many different forms and should not be construed as limited to the embodiments set forth herein; rather, these embodiments are provided for thoroughness and completeness, and fully convey the scope of the invention to the skilled person.

In plant cultivation, it is desirable to use a direct red and/or far-red light. Red light has for example the optimum wavelength for plant photosynthesis. By applying far-red an end-of-daylight treatment can be achieved which has beneficial effects on plant growth, providing longer stems, which is, for example, of importance for cut flowers and seedlings whereas expanding leafs and enhancing growth rates is of importance for leafy greens etc.

Figure 1:
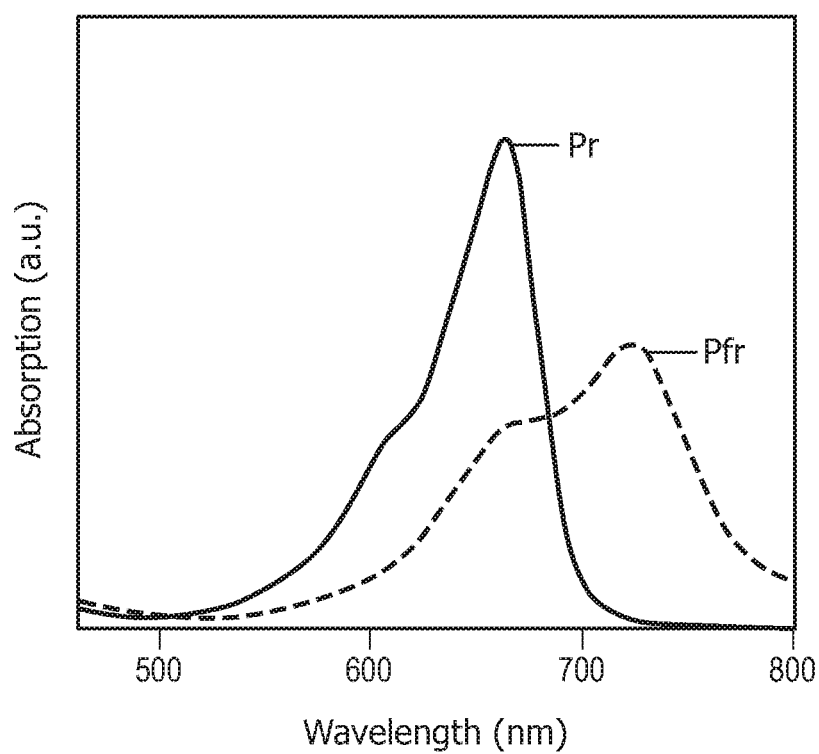
FIG. 1 shows the typical wavelength dependent absorption spectra of Phytochrome reduced (Pr) and Phytochrome far-red (Pfr).

Different forms of phytochrome, Phytochrome reduced (Pr) and Phytochrome far-red (Pfr), are involved in and regulate a range of molecular and physiological responses in plants, such as those exemplified above. As can be seen from the wavelength dependent absorption spectra of Pr and Pfr, see FIG. 1, these molecules can react to light within wavelength ranges centered in the red and far-red, respectively. By controlling the ratio of red to far-red illumination of the plant it is therefore possible to via the photophysiological response of Pr and Pfr control physiological processes in plants like blossom induction, stem stretching, germination etc.

A general idea of this invention is to provide an efficient method and a lighting device for generating light in the far-red wavelength region of the light spectrum. According to an embodiment of the present invention this can be achieved by utilizing a solid state light source emitting direct red light together with a wavelength converting member which is arranged to convert said direct red light to said far-red light. The small shift in wavelength between the red and far-red light has inherently lower Stoke losses, compared to methods utilizing blue light or UV-light conversion, allowing for the realization of a more efficient illumination of plants. The low number of components needed to achieve the desired light emission is further advantageous in view of easy assembly, low consumption of material as well as to price when producing the light source according to the present invention.

In order to facilitate a lighting device that is easy to implement in plant cultivation, the solid state light source and wavelength converting member could further be assembled to a single unit.

Figure 2:
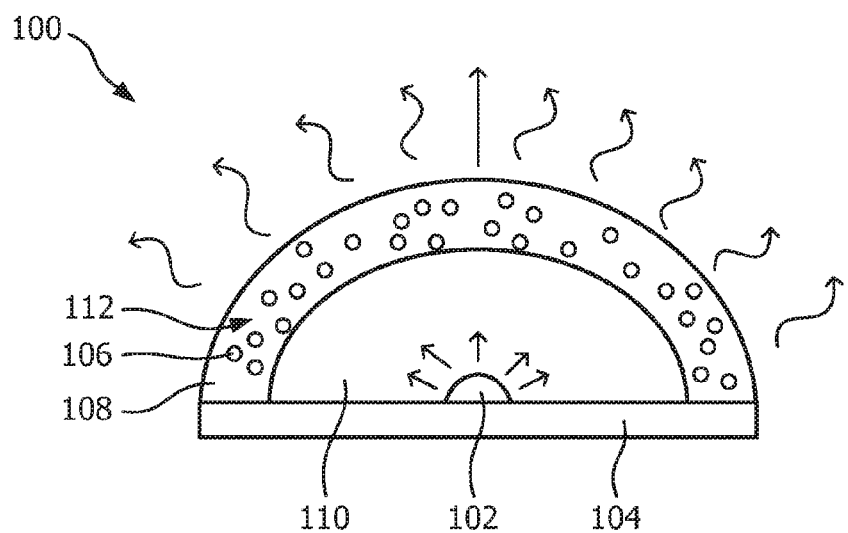
FIG. 2 shows a schematic cross-sectional side view of the basic structure of a lighting device according to a presently preferred embodiment of the invention.

FIG. 2 illustrates a schematic cross-sectional side view of the basic structure of a horticulture lighting device 100 according to a presently preferred embodiment of the invention. The lighting device comprises a solid state light source 102 (in this embodiment a LED) on a support 104 arranged to emit direct red light and wavelength converting members 106 arranged to convert said direct red light to far-red light. According to the embodiment, as illustrated in FIG. 2 are said wavelength converting members 106 dispersed in a host material 108, forming a wavelength converting member layer 112. The host material 108 may be at least semi-transparent for light in the wavelength ranges relevant for the present invention. It should be noted that an embodiment as disclosed in FIG. 2 has the advantage that the wavelength converting members 106 can be located at a distance from the solid state light source 102 thereby reducing thermal contact to the solid state light source 102 which could otherwise have a negative effect on the physical properties of the wavelength converting members 106, the solid state light source 102, or both. The design further provides greater possibilities to tailor the optical properties of the constituting parts in order to improve the light output from the device, via the choice of (an) intermediate material layer/layers 110 separating the wavelength converting member layer 112 and the solid state light source 102. It is, however, also possible within the scope of the present invention to at least partly locate the wavelength converting members directly on the solid state light source.

As non-limiting examples the host material is made of a transparent polymer material, for example acrylic polymers such as polymethylmethacrylate (PMMA), polyesters such as polycarbonate (PC) and polyethyleneterephthalate (PET), epoxies, polyvinylalcohol (PVA), polyurethane, polystyrene, or silicones. Possibly the wavelength converting member layer consists of particles of the wavelength converting member dispersed in one or more of the above mentioned host materials, which are then embedded in one or more other host materials chosen from above mentioned materials.

Alternatively, the host material can be a glass or a ceramic material.

Alternatively, the wavelength converting member layer can be formed fully by the wavelength converting member itself, for example in the case the wavelength converting member is an inorganic phosphor it can be a shaped ceramic component or it can be a grown single crystal.

The wavelength converting member layer can for instance be a free-standing component, or can be applied on a substrate by for example coating, printing or gluing.

As a non-limiting example the intermediate material layer/layers is/are made of air, or a transparent material chosen from, for example, silicones or epoxies.

According to another embodiment, it is possible to adjust the fraction of said direct red light impinging on said wavelength converting member from said solid state light source. According to this embodiment the lighting device comprises a solid state light source, a wavelength converting member, and possibly a shielding means. By changing a position of the wavelength converting member, and/or by changing a position of said solid state light source, and/or by changing a position of said shielding means, the ratio of direct red to said far-red may be adjusted. No surplus of solid state light sources are hence required to obtain the desired light output ratio between red and far-red light from the lighting device, according to the invention which improves efficiency, simplifies assembly and further reduces costs. The topic of how to adjust the amount of light emitted from a light source, e.g. a LED, impinging on a wavelength converting member is e.g. disclosed in US 2010/0254115 to which reference is made.

Figure 3:
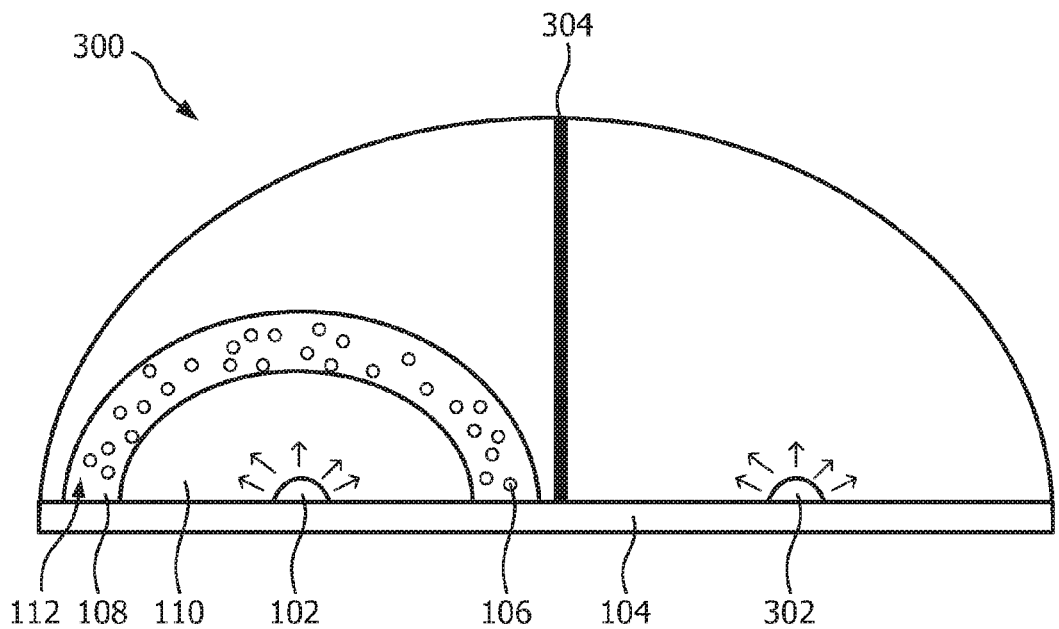
FIG. 3 shows a schematic cross-sectional side view of the basic structure of a lighting device according to an alternative embodiment of the invention, comprising an additional solid state light source.

According to another embodiment of the present invention, as illustrated in FIG. 3, the ratio of said direct red to said far-red light could be tuned, in a single horticulture lighting device 300, comprising at least one additional solid state light source 302 arranged to emit said direct red light together with the solid state light source 102 arranged to illuminate the wavelength converting members 106. In such a single lighting device unit 300 the ratio of said direct red to said far-red light is tuned by independently regulating the intensity of the solid state light source 102, being arranged to illuminate the wavelength converting members 106, and the additional solid state light source 302. In this particular embodiment, although it is not a compulsory, a reflective panel 304 is arranged in between the two said light sources to increase light emission from said single lighting device unit 300 and reduce light impinging on said wavelength converting members from said additional light source 302. This embodiment provides an additional freedom to tune the ratio of said direct red to said far-red light and improve the light intensity of the red and/or far-red spectral components, as desired for improved plant cultivation.

According to another embodiment of the present invention, the single lighting device unit comprises at least one additional solid state light source arranged to emit blue or white light, in order to further stimulate plant growth.

The wavelength converting member could comprise a phosphor material, which is, in context of the present invention, to be understood as a material or substance exhibiting light emission after excitation in luminescence, fluorescence or phosphorescence processes. Below are three different types of phosphors exemplified that may serve as efficient wavelength converting members. It should be noted that the wavelength converting members could be positioned remotely to or directly on the solid state light source.

Firstly, the wavelength converting member could comprise a Quantum Dot (QD). QDs are small crystals of semiconducting material generally having a width or diameter of only a few tens of nanometers. They have the advantage that when excited by incident light, they emit light where the wavelength of the light is determined by the size and material of the QD. Further, they show very narrow emission bands and thus provide saturated colors, where the light output of a particular color can be produced by tailoring the material and size of the QDs used. QDs with emission in the far-red upon red excitation could for instance be achieved by using QDs comprising a material selected from the group consisting of but not limited to II-VI and III-V QDs, preferably InP, CdTe, CdTe/CdSe core-shell structures, ternary mixtures such as $CdSe_xTe_y$, or chalcopyrite QDs such as $Cu_xIn_ySe_2$ or $Cu_xIn_yS_2$. The QDs can be overcoated with higher band-gap materials such as CdS and ZnS for enhanced emissive properties.

Secondly, the wavelength converting member could comprise an inorganic phosphor, wherein said inorganic phosphor comprises a material doped with $Cr^{3+}$, preferably a material selected from the group consisting of $Y_3Ga_5O_{12}$:Cr, $LaAlO_3$:Cr, and $Gd_3Ga_5O_{12}$:Cr, where $Gd_3Ga_5O_{12}$:Cr is more preferred since its low energy excitation band is located around 650 nm. Alternatively, (Zn,Cd)S:Ag phosphors with high Cd content can be used as these are also known to have emission maxima in the far-red.

Thirdly, the wavelength converting member could comprise a fluorescent dye, wherein said fluorescent dye is preferably an (e.g. alkoxy) substituted 3,4,9,10-perylene-tetracarboxylbis-benzimidazole (PTCBI) also referred to as perylene perinone, being a member of the family of far-red emitting dyes, and more preferably 3,4:9,10-bis(1,2-benzimidazole)-1,6,7,12-tetra(4-nonylphenoxy)perylene (syn/anti-isomers). This dye has been shown to have an absorbance at 550-670 nm and to exhibit emission in the range 650-850 nm (M. G. Debije et al, Appl. Optics 50, 163 (2011)). Furthermore a quantum yield was reported of 80% for the dye when in a polycarbonate host material. The bay-substitution of the perylene perinone is not limited to the 4-nonylphenoxy used in this example, but can be a range of other alkoxys, including other alkylphenoxys such as 4-tert-octylphenoxy.

Figure 4:
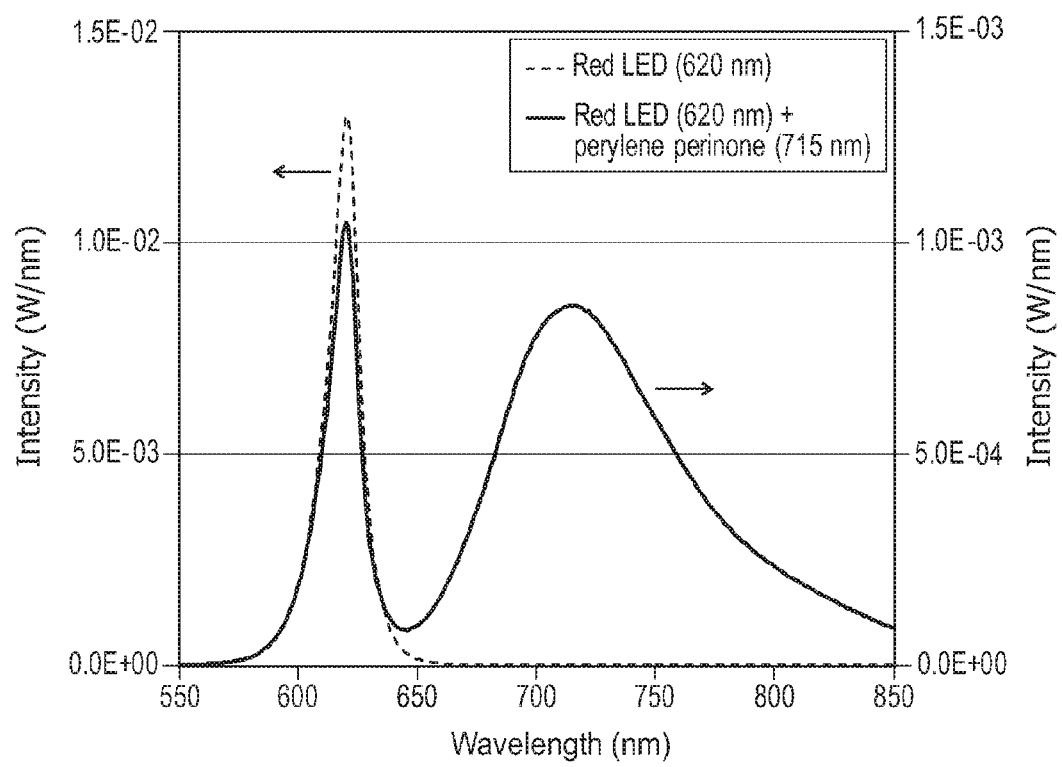
FIG. 4 illustrates light emission according to one embodiment of the present invention, pertaining to light excitation using a direct red LED to create far-red light emission by using a fluorescent dye as wavelength converting member.

It has been shown, as illustrated in FIG. 4, that using a LED emitting with a maximum emission wavelength at 620 nm it is possible to generate light emission in the wavelength range 650-850 nm by using a wavelength converting material comprising the fluorescent dye (3,4:9,10-bis(1,2-benzimidazole)-1,6,7,12-tetra(4-nonylphenoxy)perylene (syn/anti-isomers)) mixed in a 1 mm thick host material of Polymethyl methacrylate (PMMA). In this particular embodiment the host material containing the wavelength converting member was placed remotely from the LED.

The person skilled in the art realizes that the present invention by no means is limited to the preferred embodiments described above. On the contrary, many modifications and variations are possible within the scope of the appended claims.

For example, could in an embodiment of the present invention the solid state light source be an Organic Light Emitting Diode (OLED) or a Laser Diode (LD).

According to one embodiment the solid state light source could be arranged to emit light having a maximum emission wavelength of 620±10 nm. According to another embodiment the solid state light source could be arranged to emit light having a maximum emission wavelength of 640±10 nm. According to yet another embodiment the solid state light source could be arranged to emit light having a maximum emission wavelength of 660±10 nm.

Figure 5:
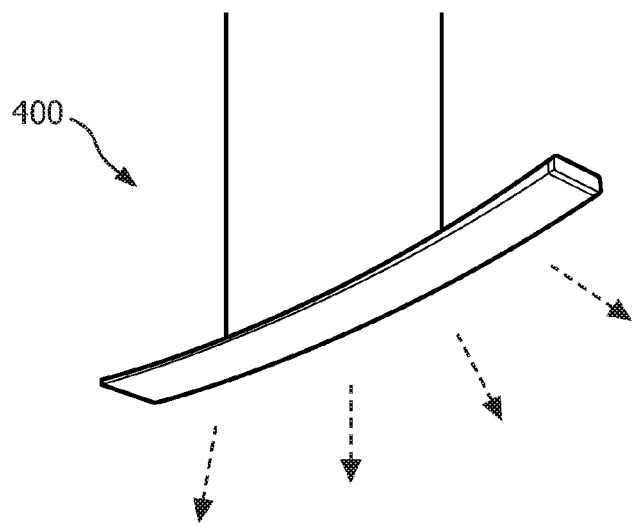
FIG. 5 illustrates a luminaire according to the third aspect of the invention.

FIG. 5 schematically shows a luminaire 400 according to the third aspect of the invention. The luminaire comprises one or more horticulture lighting devices according to the first aspect of the invention.

Figure 6:
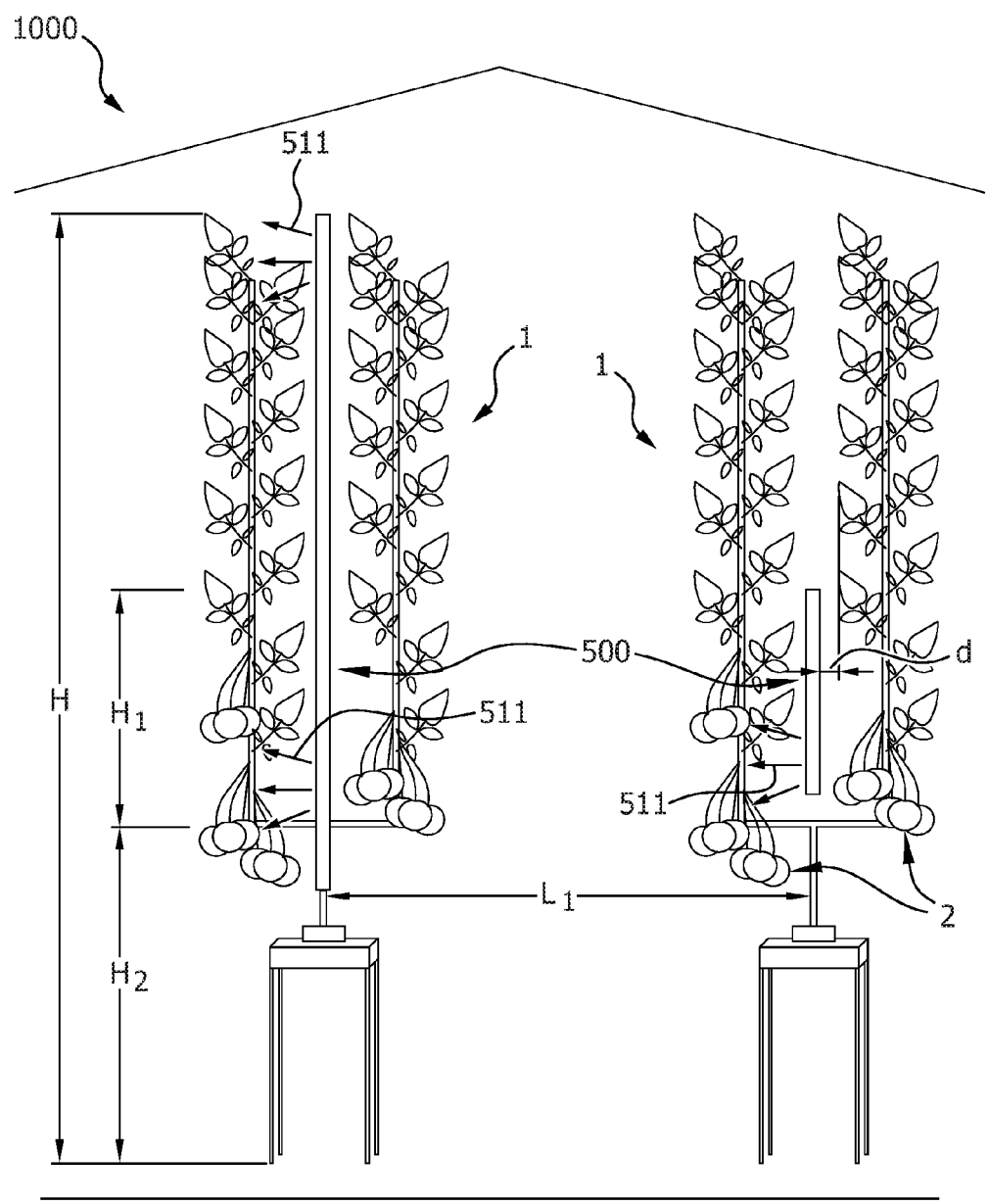
FIGS. 6 and 7 schematically depict some applications according to the fourth aspect of the invention.

FIG. 6 schematically depicts a horticulture application for tomato growth, for example. Reference 1000 indicates a horticulture application, here by way of example a greenhouse. The horticulture crop is indicated with reference 1. Reference 2 indicates the possible fruit(s), tomatoes in this case. The tomato crop is only used as example to illustrate some aspects. The crops or tomato plants are arranged in rows. The interdistance between the rows, and hence between the plants, is indicated with reference L1, and can for instance be in the range of 1-2 m, such as 1.5 m. The total height from ground level, indicated with reference H may e.g. be in the range of 2-4 m, such as about 3 m. The part of this total height which is especially relevant for horticulture lighting may cover a height H1, and is in the range of 0.5-1 m, and is about a height H2 above ground level, which height H2 may be in the range of 0.5-1.5 m, especially about 1 m. The luminaire 500, may especially address the horticulture crop over said height H1; however, on the left side a relative high luminaire 500 is shown, just by way of example. Reference d indicates the distance between the (light emitting surface(s) of the) luminaire 500 and the crop 1. Reference 511 indicates the horticulture light that is generated by the luminaire 500 during operation. The luminaire 500 may comprise a plurality of horticulture lighting devices 100.

Figure 7:
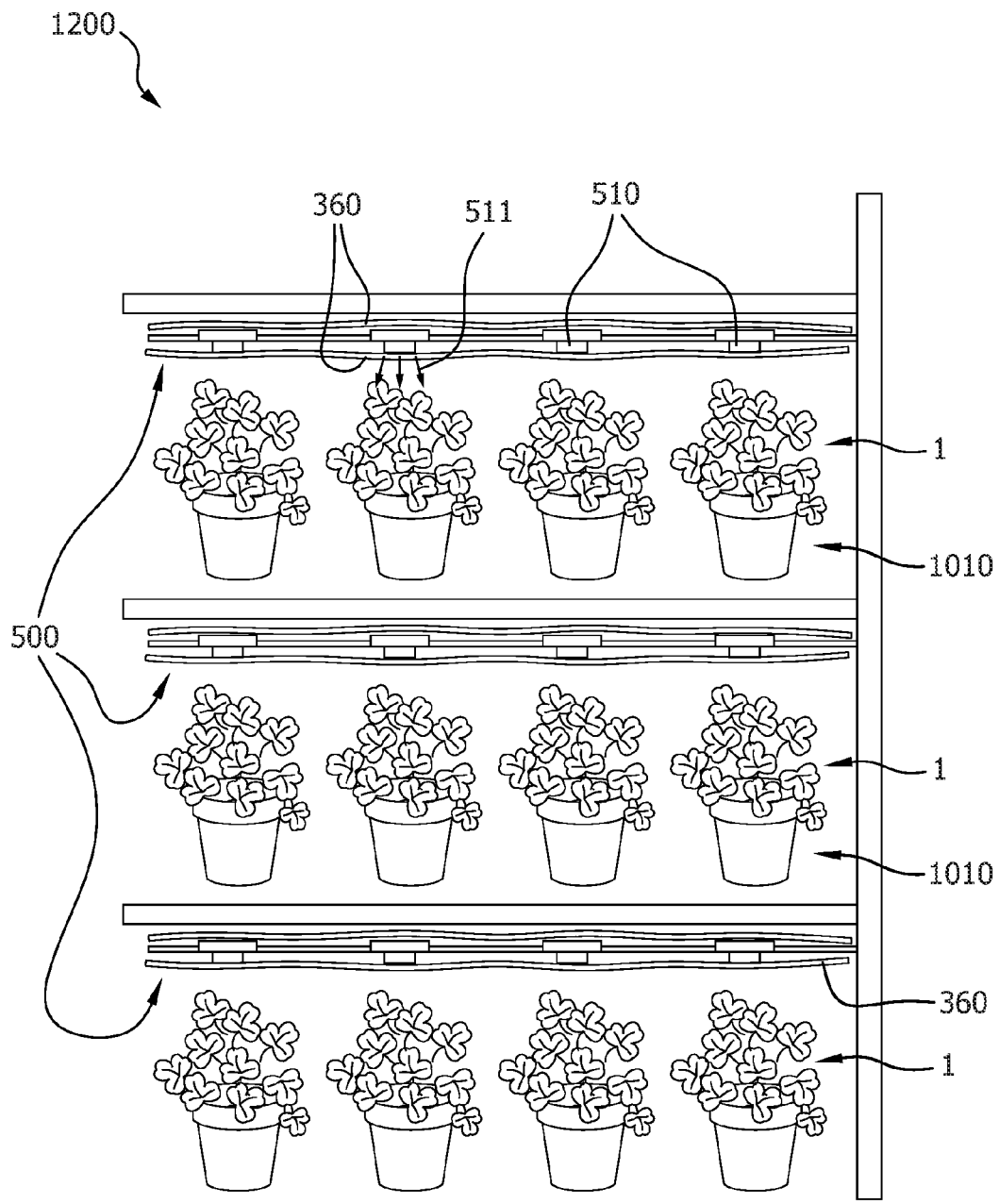

Another embodiment of a horticulture application will be discussed next with reference to FIG. 7. Reference 1200 indicates a horticulture application, here by way of example a plant factory having a plurality of rows of crops 1. In this embodiment, the luminaires 500 as described herein, are used for multi-layer growth. The multiple layers are indicated with references 1010. In this case it is beneficial that all horticulture lighting devices 510, during operation, emit the horticulture light 511 in the same direction towards the plants. In this case, it may be advantageous to sandwich the horticulture lighting devices 510 in between two foils 360. Preferably, the foil at the back of the horticulture lighting device 510 is made diffuse reflecting by incorporating a layer that contains a white paint based on particles such as $TiO_2$. The advantage is that light that is reflected by the plant back to the luminaire 500 is recycled.

Additionally, variations to the disclosed embodiments can be understood and effected by the skilled person in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

The invention claimed is:

1. A horticulture lighting device, comprising:
   a first solid state light source arranged to emit direct red light having a maximum emission wavelength of 600 to 680 nm, preferably 640 to 680 nm,
   a wavelength converting member arranged to receive at least part of said direct red light emitted from said first solid state light source and to convert said received direct red light to far-red light having a maximum emission wavelength of 700 to 760 nm, preferably 720 to 760 nm,
   an additional solid state light source arranged to emit said direct red light, and
   a reflective panel arranged in between the first solid state light source and said additional light source to reduce light impinging on said wavelength converting member from said additional light source;
   wherein each of said solid state light sources, the reflective panel, and said wavelength converting member is assembled to a single unit; and,
   wherein a ratio of said direct red to said far-red light emitted from said lighting device is set by adjusting the fraction of said direct red light impinging on said wavelength converting member from said first solid state light source and by independently regulating the intensity of light emitted by each of said solid state light sources.

2. The horticulture lighting device according to claim 1, wherein said wavelength converting member comprises a quantum dot, inorganic phosphor, and/or a fluorescent dye.

3. The horticulture lighting device according to claim 2, wherein said quantum dot comprises material selected from the group consisting of II-VI and III-V quantum dots, preferably InP, CdTe, CdTe/CdSe core-shell structures, ternary mixtures such as $CdSe_xTe_y$, or chalcopyrite quantum dots such as $Cu_xIn_ySe_2$, or $Cu_xIn_yS_2$.

4. The horticulture lighting device according to claim 2, wherein said inorganic phosphor, comprises a material doped with $Cr^{3+}$, preferably a material selected from the group consisting of $Y_3Ga_5O_{12}$:Cr, $LaAlO_3$:Cr, and $Gd_3Ga_5O_{12}$:Cr.

5. The horticulture lighting device according to claim 2, wherein said fluorescent dye preferably comprises an (e.g. alkoxy) substituted 3,4,9,10-perylene-tetracarboxylbis-benzimidazole (PTCBI) also referred to as perylene perinone, being a member of the family of far-red emitting dyes, and more preferably 3,4:9,10-bis(1,2-benzimidazole)-1,6,7,12-tetra(4-nonylphenoxy)perylene (syn/anti-isomers).

6. The horticulture lighting device according to claim 1, comprising at least one additional solid state light source arranged to emit blue or white light.

7. A luminaire comprising at least one horticulture lighting device according to claim 1.

8. A horticulture application selected from a group comprising at least a greenhouse and a plant factory, wherein the horticulture application further comprises at least one horticulture lighting device according to claim 1.

9. The horticulture lighting device of claim 1 further comprising at least one intermediate material layer located at a distance from said first solid state light source and separating said first solid state light source from said wavelength converting member.

10. The horticulture lighting device of claim 9 wherein the intermediate layer comprises a layer of air.

11. The horticulture lighting device of claim 1 wherein the fraction of said direct red light impinging on said wavelength converting member from said first solid state light source is adjusted by changing a position of the wavelength converting member, and/or by changing a position of said solid state light source.

12. A method to stimulate plant growth and bio-rhythm of a plant, using solid state light sources, a reflective panel arranged between said light sources, and a wavelength converting member, all being arranged in a single unit, the method comprising the steps of:
   generating, by a first solid state light source and by a second solid state light source, direct red light having a maximum emission wavelength of 600 to 680 nm, preferably 640 to 680 nm;
   positioning an intermediate layer between said wavelength converting member and said first solid state light source;

receiving at least part of said direct red light generating by said first solid state light source at said wavelength converting member;

blocking by said reflective panel said direct red light generating by said second solid state light source from being received at said wavelength converting member;

converting said received direct red light to far-red light having a maximum emission wavelength of 700 to 760 nm, preferably 720 to 760 nm, using said wavelength converting member;

wherein a ratio of said direct red to said far-red light emitted is set by adjusting the amount of said direct red light impinging on said wavelength converting member from said first solid state light source and by independently regulating the intensity of light emitted by each of said first and second solid state light sources.

13. The method according to claim 12, wherein said wavelength converting member comprises a fluorescent dye, wherein said fluorescent dye preferable comprises an (e.g. alkoxy) substituted 3,4,9,10-perylene-tetracarboxylbis-benzimidazole (PTCBI) also referred to as perylene perinone, being a member of the family of far-red emitting dyes, and more preferable 3,4:9,10-bis(1,2-benzimidazole)-1,6,7,12-tetra(4-nonylphenoxy)perylene (syn/anti-isomers).

* * * * *